United States Patent [19]

Wanlass

[11] Patent Number: 5,168,176
[45] Date of Patent: Dec. 1, 1992

[54] APPARATUS AND METHOD TO PREVENT THE UNSETTLING OF A QUIESCENT, LOW OUTPUT CHANNEL CAUSED BY GROUND BOUNCE INDUCED BY NEIGHBORING OUTPUT CHANNELS

[75] Inventor: Frank M. Wanlass, Sunnyvale, Calif.

[73] Assignee: Standard Microsystems Corporation, Hauppauge, N.Y.

[21] Appl. No.: 734,554

[22] Filed: Jul. 23, 1991

[51] Int. Cl.⁵ .......................................... H03K 19/003
[52] U.S. Cl. ...................... 307/443; 307/263; 307/317.2
[58] Field of Search ............... 307/443, 263, 451, 475, 307/585, 448, 473, 317.2, 522

[56] References Cited

U.S. PATENT DOCUMENTS

| | | | |
|---|---|---|---|
| 4,622,482 | 11/1986 | Ganger | 307/585 |
| 4,638,187 | 1/1987 | Boler et al. | 307/451 |
| 4,731,553 | 3/1988 | Van Lehn | 307/443 |
| 4,758,739 | 7/1988 | Ovens | 307/443 |
| 4,777,389 | 10/1988 | Wu et al. | 307/443 |
| 4,785,201 | 11/1988 | Martinez | 307/443 |
| 4,928,023 | 5/1990 | Marshall | 307/443 |
| 4,931,669 | 6/1990 | Higashisaka | 307/263 |
| 4,973,865 | 11/1990 | Hag | 307/443 |
| 5,028,818 | 7/1991 | Go Ang | 307/443 |
| 5,034,631 | 7/1991 | Mouret | 307/443 |
| 5,089,721 | 2/1992 | Luich | 307/443 |

Primary Examiner—Eugene R. LaRoche
Assistant Examiner—A. Zarabian
Attorney, Agent, or Firm—Law Offices of Thomas E. Schatzel

[57] ABSTRACT

A method of controlling the ill-effects of ground bounce in a CMOS device, according to the present invention, comprises increasing the impedance between (1) the output line of a quiescent channel that is already at a low state, and (2) the local ground within the CMOS device; the increased impedance occurring when a ground bounce condition caused by an adjacent channel within the CMOS device would otherwise cause the output of the quiescent channel to be dragged high.

17 Claims, 3 Drawing Sheets

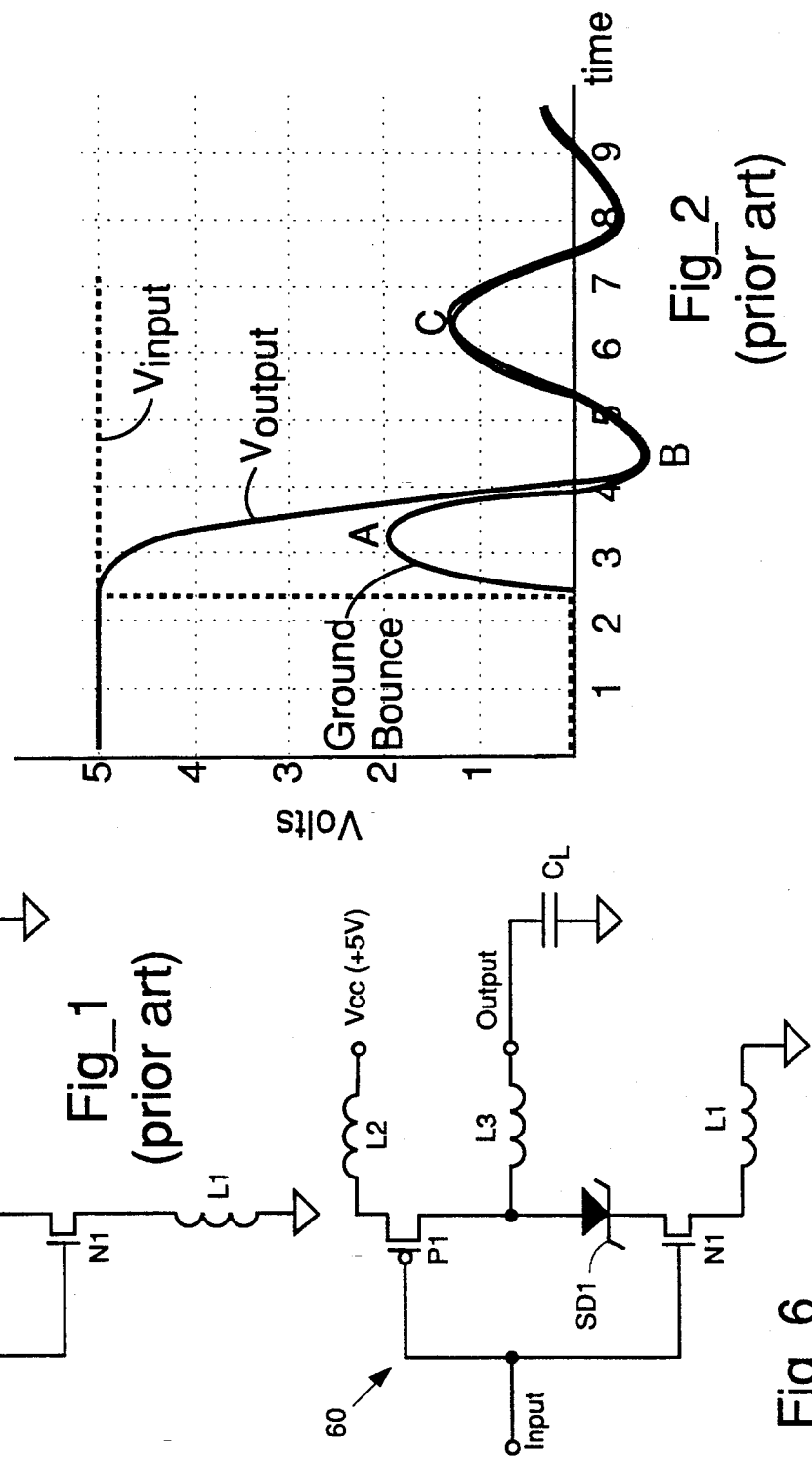

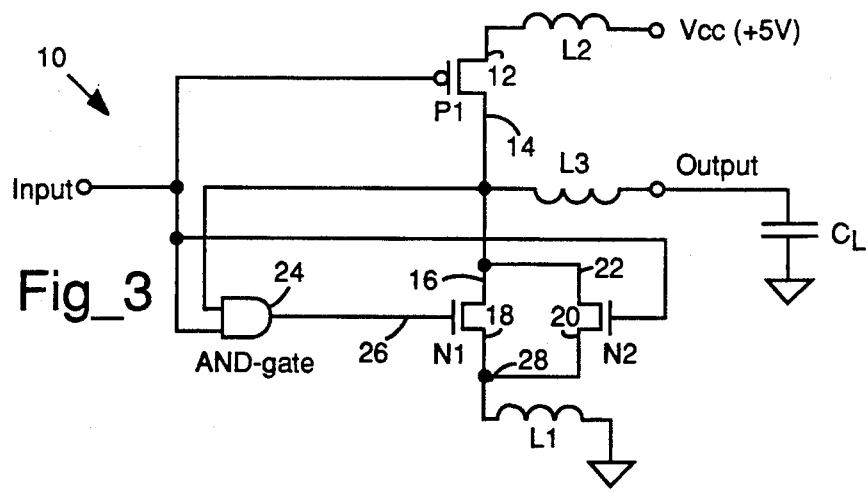
Fig_3
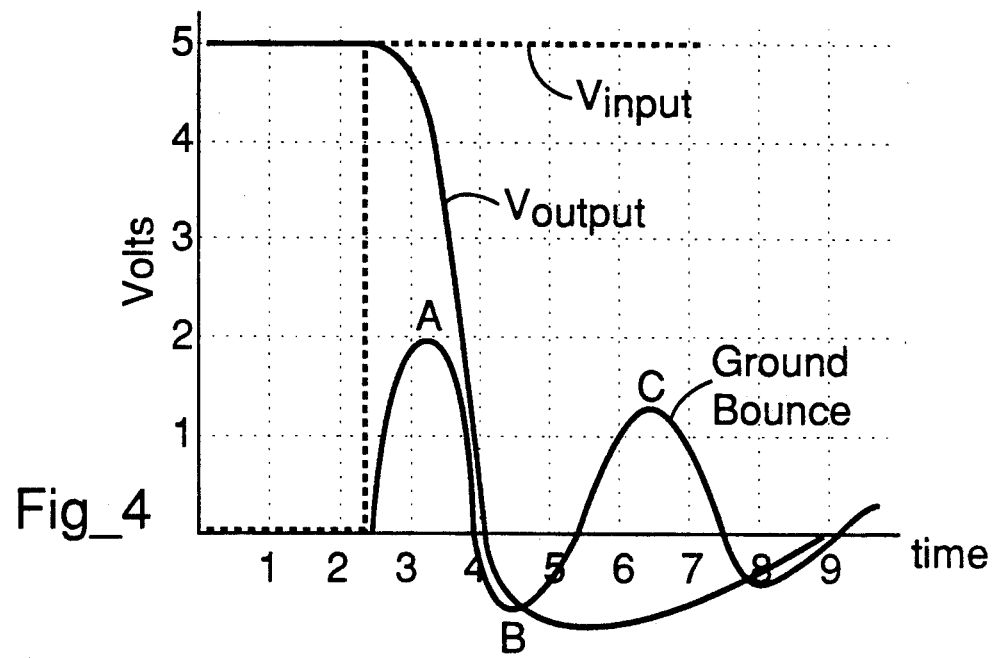
Fig_4
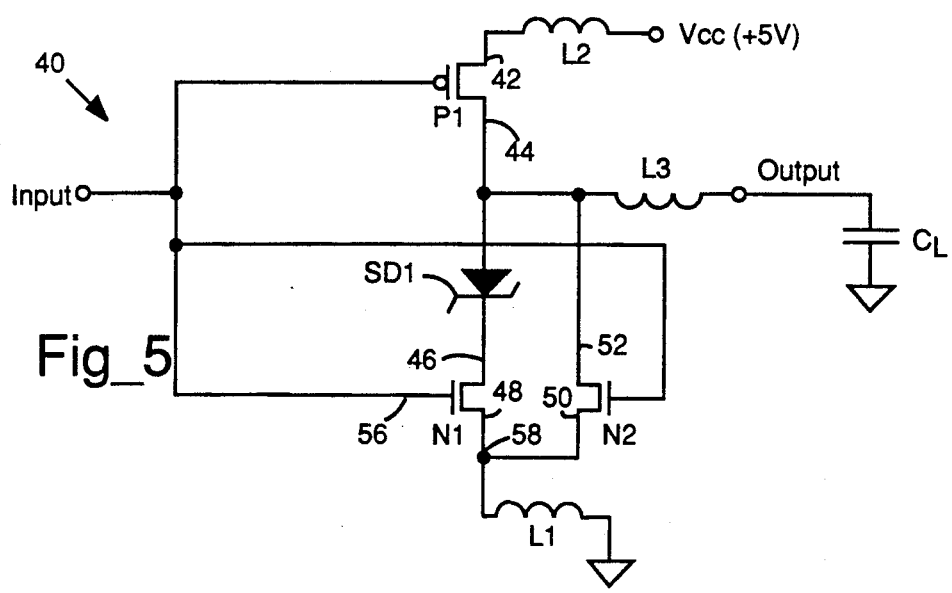
Fig_5

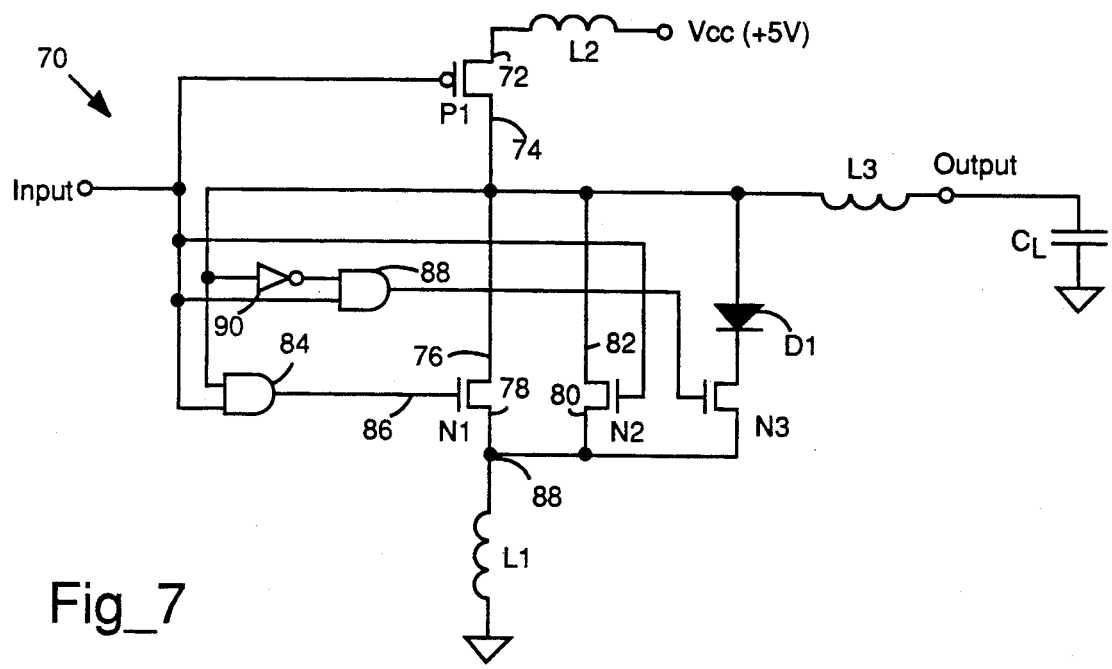
Fig_7 ns***

APPARATUS AND METHOD TO PREVENT THE UNSETTLING OF A QUIESCENT, LOW OUTPUT CHANNEL CAUSED BY GROUND BOUNCE INDUCED BY NEIGHBORING OUTPUT CHANNELS

BACKGROUND OF THE INVENTION

1. Field of the Invention

The invention relates generally to digital CMOS (Complimentary Metal Oxide Semiconductor) circuits and more particularly to digital circuit design techniques in semiconductor devices which reduce output ringing in very fast CMOS output configurations.

2. Description of the Prior Art

The need for increasing levels of throughput and the resulting improved performance in today's CMOS systems requires high speed and high dynamic drive current that interface chips to circuit boards or backplanes. The high speed and high current drive levels can be easily achieved by modern submicron CMOS processing, but there are a few undesirable side effects.

Higher rates of change (di/dt) in all switching transistors result from the much faster slewing of the internal nodes in current technology devices. Output devices are designed to handle high levels of output current and the consequential di/dt can be exceedingly high. Some devices that have many of their outputs switching simultaneously can experience di/dt levels of 500 milliamps per nanosecond in their common ground or Vcc leads. A certain amount of inductance in these leads is unavoidable and significant voltages can be developed across relatively small inductive reactances when di/dt levels are high. The "lead" inductance often referred to in this connection usually includes the combination of bonding wire and package pin inductances.

FIG. 1 shows a prior art CMOS output driver arrangement and shows the package lead inductances as $L_1$-$L_3$ and an external load capacitance $C_L$ that is fifty picofarads. Transistors $N_1$ (NMOS) and $P_1$ (PMOS) are designed to be large enough to source or sink about 100 mA. The typical high-speed CMOS chip has many such drivers that all share the same on-chip power and ground rails. A particular area of concern is the case where most of the outputs switch from logic HIGH to LOW by turning on transistors $N_1$. This will generate a voltage fluctuation of the on-chip ground compared to the system ground. This condition is commonly known as "ground bounce." Too severe a ground bounce will cause false level transitions in both the driving and driven devices. Less severe ground bounce will decrease noise immunity, because positive ground bounce robs from Voltage Input High ($V_{ih}$) margins and negative ground bounce cuts into Voltage Input Low ($V_{IL}$) margins. Ground bounce effects are sensitive to process, temperature, and operating voltage variations. "Fast" processes, low temperatures, and high operating voltages can each increase ground bounce effects. Device speed, a dominant parameter, is the worst at the opposite extremes: slow processes, high temperatures, and low operating voltages. Testing for speed receives so much attention at its worst case extremes, that the worst case extremes for ground bounce are often ignored.

In FIG. 2, the positive half cycle ground bounce that peaks at "A" primarily results from the rate of change of current (di/dt) of one buffer times the ground lead inductance $L_1$ times the number of buffers simultaneously switching their respective $N_1$ devices to ON.

The di/dt rate is determined by the rate at which the gate voltage ($V_g$) to source voltage ($V_s$) of $N_1$ changes ($dV_{gs}/dt$). During the first part of the output fall time, the ground voltage rises while the output voltage ($V_o$) falls. This forces $N_1$ into its linear region of operation. Transistor $N_1$ then is the equivalent of a resistor having a resistance $R_{on}$, and that can be as high as a few tens of ohms for a high-speed buffer. For the remainder of the output voltage excursion, the equivalent circuit of the output can be treated as if it were a resonant L-C-R circuit consisting of the ground and output lead inductance ($L_1$ and $L_3$), the load capacitance $C_L$, and the total loop resistance which includes $R_{on}$. The resonant frequency is determined by the net values of inductance and capacitance, while the damping is determined by the inductance and the total resistance of the loop. If $L_1$ is large enough and $R_{on}$ is small enough, the ground bounce will oscillate through several Cycles, as shown in FIG. 2. False triggering can be caused if point "C" exceeds a logic HIGH. The whole of a device's noise margin can also be exceeded if the peak at point "A" (in a device having quiescent output at a logic LOW) rises higher than the input threshold of a circuit driven by the quiet output.

The prior art has attempted to correct ground bounce. Different approaches have been tried, but practically all have achieved less than a complete solution. The most common work-around solution has been to slow down the positive going rate-of-change of Vgs by inserting an appropriate delay network between Vg and the gate of $N_1$. If $N_1$ has a slow enough positive rise, then the amplitudes of points "A", "B", and "C" in FIG. 2 will be reduced. However, in order to have a significant ground bounce reduction, a buffer driving a fifty picofarad load might have to slow its HIGH to LOW transition from one and a half nanoseconds to six nanoseconds. The exact amount of slowdown required depends on the package pin inductances and the number of outputs that *might* be simultaneously switching. A delay that is enough for the case when all outputs are switching will be excessive for cases when fewer than that number are switching. With some devices now having as many as 32 outputs, the ground bounce solutions chosen can have a major influence in a device's high speed performance.

Another common technique employed to control ground bounce involves distributing the current running through pull-down devices. Multiple pulldown devices each handle a reduced portion of the whole current and are successively turned on via a delay chain. Consider the prior art found in U.S. Pat. No. 4,785,201 by Martinez. The circuit of Martinez uses a P-type Metal Oxide Semiconductor (PMOS) pull-up transistor and a N-type Metal Oxide Semiconductor (NMOS) pull-down transistor as a pair of strong driving elements. (The parasitic, but "unavoidable series inductance to system ground" is shown as a discrete inductor, and a matching inductor to $V_{cc}$.) A PMOS pull-up transistor and a NMOS pull-down transistor form a pair of weak driving elements. The weaker pair are designed to turn on prior to the stronger pair via delays introduced by a pair of inverter transistors. The main idea is that the large current spike created when a large lumped device is turned on will be decreased in intensity if a previously activated weaker device dissipates some of the initial discharge energy. The gain of the stronger devices can be slightly lower than would otherwise be required. The U.S. Pat. No. of Bolar et al., 4,638,187, avoids using a PMOS pull-down as a weaker device, and instead uses another NMOS pulldown transistor. This weaker pull-down transistor has a smaller gain than the main NMOS pull-down. The delay is introduced by an R-C network that includes a resistor (and stray capacitance), instead of an inverter chain. U.S. Pat. No. 4,777,389, by Wu et al., discloses a circuit that essentially uses the same current distribution as above, but uses a different method of achieving the delay for the second, stronger pull-down transistor. The delay in turning on the second, stronger pull-down transistor results from a closed loop control that waits for the high to low transition of the output to reach a certain level before a pull-down transistor is activated. This assures an adequate time spacing between the two current spikes. None of the prior art above directly monitor or control the particular electrical parameter that results in ground bounce, namely, the time rate of change of the pull-down current (di/dt). The sensitivities to process, temperature, and operating voltage also go largely neglected. The U.S. Pat. No. 4,622,482, of Ganger, directs itself to limiting the output voltage slew rate in telecommunications applications. A pair of fixed capacitors, and a pair of constant current sources, are each used to perform slew rate limiting and to insure linearity. Several undesirable consequences result from the implementation. Biasing circuits are required to provide N-bias and P-bias potentials, thereby requiring an accurate source externally and therefore extra I/O pins. Alternatively, internally generated biases would necessitate generators with large static DC currents to sustain a reasonable noise rejection ratio. A complementary pair of push-pull transistors and are never mutually exclusive because their gates are not pulled completely up to Vdd or down to Vss when intended to be off. This results in large leakage currents that are usually unacceptable in digital circuits. And since the push-pull transistors are never quite off, parasitic capacitive coupling in their gates to Vdd and Vss will cause the push-pull transistors to amplify any high-frequency noise on the Vdd and Vss supply rails. Slew-rate control is confined only to the saturation region of the output transistors when static biasing is used. Since the value of capacitors do not change to accommodate the push-pull transistors transition from their saturation region to their linear region, the linearity control fails at this stage and throughout the linear region of operation. The capacitive coupling provided by capacitors will couple any output transition back to the gate of the supposedly off transistor to cause it to turn on. While the resulting current contention has the effect of further limiting the voltage slew rate of the output, it inadvertently dumps even more transient and DC current to Vss, which actually increases ground bounce in digital circuits.

Lien, et al., in U.S. Pat. No. 4,933,574, disclose a BiCMOS output driver that is intended to maximize switching speed and to minimize ground bounce. A bipolar transistor in the output is not permitted to go into saturation. A pair of transistors, connected in an inverter configuration, develop a signal that indicates when the bipolar transistor pulls-down the output below a predetermined point. Three gate delay times after the output falls below a second predetermined level, a second transistor in parallel with the bipolar transistor is switched.

The prior art has more-or-less been directed at controlling ground bounce for channels that are actively switching their outputs from high to low. The popular technique, described above, is to use two output pull-down transistors to ease up on the rate of output slew from high to low. What is needed is a solution that addresses the problem of quiescent channels that are already low and become unsettled by local ground bounce induced by a neighboring output channel. The present invention provides such a solution. Two output pull-down transistors in parallel decouple the quiescent, low channel from a local ground by turning-off the output transistor with the lower $R_{on}$ resistance, during positive swings of the local ground caused by ground bounce.

SUMMARY OF THE PRESENT INVENTION

It is therefore an object of the present invention to provide a circuit that eliminates the deleterious effects of ground bounce without having to slow down the operation of high-speed CMOS drivers.

Briefly, a first embodiment of the present invention is a CMOS device having many output channels at least one of which channel comprises (1) a high sink current driver, with an $R_{on}$ of about ten ohms, that is ON only during the time the output is falling and still a logic HIGH, (2) an AND gate, and (3) a second sink transistor having an $R_{on}$ of about 5K ohms, all of which are combined into an output buffer such that the output of the AND-gate switches LOW when the voltage at the output of the buffer drops below about 1.5 volts. At that threshold, the high current sink transistor turns off, leaving the weaker, second sink transistor ON to pull the output of the buffer LOW. Any tendency of the output of the buffer to ring HIGH above the threshold of the AND gate will be clamped by the high sink current transistor.

A second embodiment comprises the first embodiment, but with the elimination of the AND gate, and instead a Schottky diode between the first sink transistor and the output. When a system connected to the output has been driven low, a ground bounce in the CMOS device severe enough to lift the local ground inside the CMOS device positive more than a few hundred millivolts will reverse bias the Schottky diode. The clamping of the output to local ground will thereby be released and the output cannot be dragged high by transients on the local ground. A third embodiment comprises the above Schottky diode in an otherwise standard output buffer arrangement.

A method of controlling the ill-effects of ground bounce in a CMOS device, according to the present invention, comprises increasing the impedance between (1) the output line of a quiescent channel that is already at a low state, and (2) the local ground within the CMOS device; the increased impedance occurring when a ground bounce condition caused by an adjacent channel within the CMOS device would otherwise cause the output of the quiescent channel to be dragged high.

An advantage of the present invention is that ground bounce peaks are effectively clipped and false triggering in nearby associated circuits is reduced or completely eliminated.

Another advantage of the present invention is large output sink currents ($I_{OL}$) can be obtained without exacerbating ground bounce.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a circuit diagram of a prior art CMOS buffer;

FIG. 2 is a plot of the voltage waveforms associated with the circuit of FIG. 1;

FIG. 3 is a circuit diagram of the first embodiment of the present invention comprising a split output current sink path;

FIG. 4 is a plot of the voltage waveforms associated with the circuit of FIG. 3;

FIG. 5 is a circuit diagram of the second embodiment of the present invention comprising a split output current sink path and a Schottky diode;

FIG. 6 is a circuit diagram of the third embodiment of the present invention comprising a Schottky diode; and FIG. 7 is a schematic diagram of the fourth embodiment of the present invention which includes a transistor in series with a common diode.

DETAILED DESCRIPTION OF THE PREFERRED EMBODIMENTS

As illustrated in FIG. 3, a first embodiment of the present invention is a CMOS device 10 comprised of a relatively large PMOS pull-up transistor 12 ($P_1$) having drain 14 tied to drain 16 of a relatively large NMOS pull-down transistor 18 ($N_1$). A relatively small NMOS pull-down transistor 20 ($N_2$) has its drain 22 connected to drain 16 such that the sinking current of device 10 is split between transistors 18 and 20 when both are turned on. (Sinking current is that current that flows to pull the output lower toward system ground; sourcing current is that current that pulls the output higher toward Vcc.) The $R_{on}$ of transistor 18 is about ten to forty ohms and the $R_{on}$ of transistor 20 is about 1,000 to 10,000 ohms. The current through transistor 18 will therefore be greater than the current through transistor 20. An AND-gate 24 controls gate 26 of transistor 18. Preferably, AND-gate 24 comprises transistors that have been sized for minimum delay in driving the large gate capacitance of transistor 18. For FIG. 4, discussed below, ground bounce is measured at a point 28 that is common to the sources of transistors 18 and 20 and inductor $L_1$. Point 28 represents a local ground common to all channels within device 10. The bottom of $L_1$ and $C_L$ are at system ground. Inductances $L_1$–$L_3$ represent the respective lead inductances of the integrated circuit, bonding wires, and leads associated with device 10. The output load of device 10 is represented by a capacitive load $C_L$ of approximately fifty picofarads. Transistor 12 can alternatively be an NMOS type transistor connected in a source follower mode. A suitable inverter is included to invert the buffer input signal to the gate of the gate of the NMOS source follower.

FIG. 4 shows that the output voltage ($V_{output}$) of device 10 responds to the input voltage ($V_{input}$) in a more controlled way than was the case in FIG. 2. The ground bounce at point 28 continues its gyrations from peaks "A" to "B" to "C", but $V_{output}$ does not track it because the output is no longer locked to point 28 by transistor 18. When $V_{input}$ takes a step to HIGH as indicated in FIG. 4, both transistors 18 and 20 will be turned on hard. The output $V_{output}$ will fall to about 1.5 volts where AND-gate 24 will turn-off transistor 26 by dropping gate 26 to LOW. Since the ON resistance ($R_{on}$) of transistor 20 is about 1,000 to 10,000 ohms, $V_{output}$ will be over damped and the tendency for the output to ring will be suppressed.

The AND-gate 24 may experience a shift during adjacent-channel-induced ground bounce in its minimum $V_{ih}$ (logic on) upwards during the swing of point 28 through peak "A". For this reason, the $V_{ih}$ of AND-gate 24 should be set lower than if AND-gate 24 was a stand-alone five volt logic element. It is also advantageous to have a lower $V_{ih}$ to cut short the positive swing of the output going high as a consequence of $N_1$ and $N_2$ clamping the output to point 28 while point 28 swings up through peak "A". If the output voltage swing does not signal AND-gate 24 to switch until the output has swung as high as a standard $V_{ih}$, then the action of AND-gate 24 would come too late. The embodiments described below may be preferable for these reasons.

FIG. 5 is a second embodiment of the present invention which is a CMOS device 40 comprised of a relatively large PMOS pull-up transistor 42 ($P_1$) having drain 44 tied through Schottky diode SD1 to drain 46 of a large NMOS pull-down transistor 48 ($N_1$). A small NMOS pull-down transistor 20 ($N_2$) has its drain 52 connected to drain 44 such that the sinking current at the output of device 40 is split (albeit unevenly) between transistors 48 and 50 when both are turned on. The $R_{on}$ of transistor 48 is about ten to forty ohms and the $R_{on}$ of transistor 50 is about 1,000 to 10,000 ohms. The current through transistor 48 will therefore be greater than the current through transistor 50. The output load of device 40 is represented, as above, by a capacitive load $C_L$ of approximately fifty picofarads. The principal difference between device 10 and device 40 is the addition of Schottky diode SD1 in the latter and the AND gate elimination. A Schottky diode type is preferred over an ordinary silicon diode type because the switching speed is faster and the forward bias voltage is lower for the Schottky diode. Forward bias voltages are on the order of a few hundred millivolts.

The action of Schottky diode SD1 helps keep a quiescent channel that is already at a logic low from becoming unsettled in sympathy with nearby channels generating large ground bounce voltages. Schottky diode SD1 will increase its impedance beginning immediately with any movement of drain 46 of transistor 48 toward Vcc. Such a movement will cause the forward bias voltage across Schottky diode SD1 to fall short of what is needed to sustain a current. A still further swing toward Vcc will, at some point, cause Schottky diode SD1 to reverse bias. This, of course, will put Schottky diode SD1 in its maximum impedance condition. The output of device 40 will tend to resist ground bounce induced swings due to the capacitive effects of $C_L$. In prior art circuits, this inertia to stay at ground (once low) was overcome deliberately by $P_1$ switching on, and unintentionally by $N_1$ dragging the output along with the local ground's ground bounce excursions. Here, the inertia to stay at ground is used to bridge the short time needed to reapply the sinking current actions of $N_1$ and $N_2$, sometime after ground bounce peaks "A" or "C" (FIG. 4).

FIG. 6 shows how the benefits of Schottky diode SD1 alone can be usefully employed. A third embodiment of the present invention is a device 60 that differs from the prior art of FIG. 1 in that a Schottky diode SD1 has been placed in series with the drain of transistor $N_1$. The explanation given for the circuit behavior of Schottky diode SD1 in FIG. 5 applies here as well.

FIG. 7 illustrates a fourth embodiment of the present invention and is most like the first embodiment described above. Buffer 70 comprises current-source transistor P1 and three current-sink transistors $N_1$, $N_2$, and $N_3$. A first AND-gate 84 drives the gate 86 of transistor $N_1$. A second AND-gate 88 drives the gate of transistor $N_3$ and has an inverted version of the output of buffer 70 by virtue of inverter 90. Transistor $N_1$ is large and is driven on and off by AND-gate 84. ("Large" means the transistor is able to sustain a relatively larger current through its channel and has a lower ON resistance, $R_{on}$.) Transistor $N_2$ is comparatively small. The difference is that a transistor $N_3$ and a diode D1 are in parallel with N1. Transistor N3 is large and is only turned-on when the output is low and the input is high. Buffer 70 has a lower impedance to within one diode drop of ground, compared to that of buffer 10. This is mainly due to the fact that transistor N3 is large compared to N2. Surge current through diode D1 is minimized by delaying the turn-on of transistor N3 until the buffer output is low. Preferably, the peak currents through diode D1 should be minimized because an ordinary diode can inject minority carriers into a CMOS substrate when forward biased and that can result in latch-up. The above Schottky diode implementation above has the advantage of naturally avoiding minority carrier injection.

The first through fourth embodiments of the present invention, described above, have in common the ability to increase the impedance between the top of the current sink transistor $N_1$ and the output to load $C_L$ when the bottom of Current sink transistor $N_1$ swings sufficiently positive. For example, the portion of the ground bounce waveform, labelled "A" in FIG. 4, can rise higher than a quiescent voltage that had been established on the output (assuming the output was low). If a low impedance path exists between the local ground and the output, then the output will be dragged high in sympathetic movement with the ground bounce caused by adjacent channels. The embodiments described above each prevent the output from being dragged high by increasing the impedance between local ground and the output. The embodiments comprising the Schottky diode in crease impedance by reverse biasing SD1.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of controlling ground bounce in a buffer having an input and an output, the method comprising the steps of:
   splitting the output sink current of the buffer unequally between a high current sink transistor with an on resistance in the range of ten to forty ohms and a low current sink transistor with an on resistance in the range of 1,000 to 10,000 ohms, both of said transistors having a common single ground reference; and
   switching the high current sink transistor on only during the time the input of the buffer is a logic HIGH and the output of the buffer is a logic HIGH using logic means comprising transistors sized for minimum delay in driving a large gate capacitance associated with said high current sink transistor.

2. An apparatus for controlling ground bounce in a buffer having an input and an output comprising:
   a high current sink transistor with an on resistance in the range of ten to forty ohms;
   a low current sink transistor with and on resistance in the range of 1,000 to 10,000 ohms, both of the transistors having a common single ground reference;
   means for splitting an output sink current of the buffer unequally between the high current sink transistor and the low current sink transistor; and
   means for switching the high current sink transistor on only during the time the input of the buffer is a logic HIGH and the output of the buffer is a logic HIGH, the switching means comprising transistors sized for minimum delay in driving a large gate capacitance associated with said high current sink transistor.

3. The apparatus of claim 2, wherein:
   means for splitting comprises two or more transistors in parallel with independent gate controls; and
   the means for switching comprises a two input AND-gate with a first input connected to the input of the buffer, a second input connected to the output of the buffer, and the output of the AND-gate connected to control at least one and less than all of said transistors in parallel.

4. A CMOS device, comprising:
   a high current sink transistor and a low current sink transistor, both of the sink transistors connected to receive sink current at the output of the CMOS device, both of said transistors having a common single ground reference; and
   an AND-gate connected such that the high current sink transistor is turned on only during the time the input of the buffer is a logic HIGH and the output of the CMOS device is a logic HIGH.

5. The device of claim 4, wherein:
   the high current sink transistor has an on resistance $R_{on}$ of approximately ten to forty ohms; and
   the low current sink transistor has an on resistance $R_{on}$ of approximately 1,000 to 10,000 ohms.

6. The device of claim 4, wherein:
   the high current sink transistor and a low current sink transistor are NMOS type.

7. The device of claim 6, further comprising:
   a high current source transistor that pulls up the output of the buffer.

8. The device of claim 7, wherein:
   the high current source transistor is a PMOS type.

9. The device of claim 7, wherein:
   the high current source transistor is an NMOS type working in a source follower mode.

10. An improved CMOS device, the CMOS device comprising a high current source transistor and high current sink transistor, the improvement comprising;
    a low current sink transistor with an on resistance in the range of 1,000 to 10,000 ohms connected with its source and drain in parallel with the source and drain of said high current sink transistor having an on resistance in the range of ten to forty ohms, both of said high current and low current transistors having a common single ground reference; and
    an AND-gate connected such that the high current sink transistor is turned on only during the time the input of the buffer is a logic high and the output of the buffer is a logic high, the AND-gate comprising transistors sized for minimum delay in driving a large gate capacitance connected with said high current sink transistor.

11. The CMOS device of claim 10, wherein:
the AND-gate comprises means for switching the output of the gate LOW when either of two inputs of the gate drop below approximately 1.5 volts.

12. A semiconductor device having at least one input and output, the device comprising:
- a high current sink transistor and a low current sink transistor both of the transistors having a common single ground reference and interconnected with the drain of the low current transistor connected directly to the output, both of the high and low current sink transistor gates being connected to be driven by a single buffer input; and
- a Schottky diode connected in series between the high current sink transistor and a junction of the pull-up transistor and the output, the Schottky diode being connected to be forward biased by a sink current flowing from the output to the high current sink transistor and reverse biased by a condition that causes source current to flow from either of the high and low sink transistors to the output.

13. The device of claim 12, wherein:
the Schottky diode has a forward bias voltage of approximately three hundred millivolts.

14. A semiconductor device having at least one output channel comprising:
- a sink transistor connected to receive a sink current at the output of the channel; and
- a Schottky diode connected between and in series with the sink transistor on one end and a pull-up transistor and channel output on the other end, the Schottky diode being connected to be forward biased by a sink current flowing from the channel output to the sink transistor and reverse biased by a source current flowing from the sink transistor to the channel output.

15. A method of controlling sympathetic effects of ground bounce in a CMOS device having a quiescent channel with its output at a logic low and at least one adjacent channel that switches form logic high to low, the channels having a local ground in common, the method comprising the step of:
increasing the impedance between an output line of the quiescent channel and the local ground when a ground bounce condition is detected in the adjacent channel with the increase in impedance counteracting a pulling of the output of the quiescent channel high.

16. A CMOS buffer having at least one signal input, at least one signal output, and one supply node Vcc and one ground reference node, the buffer comprising:
- a current-source transistor for pulling the buffer output toward the voltage potential of the supply node Vcc, a gate of the current source transistor connected to an input of the buffer;
- a diode connected to the buffer output;
- a first, second and third current-sink transistor, the first and second current-sink transistors connected to pull the buffer output toward the voltage potential of the ground reference node, the third current-sink transistor connected to the diode to pull the buffer output toward the voltage potential of the ground reference node by forward biasing the diode, and a gate of the second current-sink transistor being connected to the buffer input;
- a first two-input AND-gate having two inputs "A1" and "B1" and an output "C1", said input "A1" being connected to the buffer input and said input "B1" being connected to the buffer output and said output "C1" being connected to a gate of the first current-sinking transistor; and
- a second two-input AND-gate having two inputs A2" and "B2" and an output "C2", said input "A2" being connected to the buffer input and said input "B2" being connected through an inverter to the buffer output and said output "C2" being connected to the gate of the third current-sink transistor.

17. The buffer of claim 16, wherein:
the third current-sink transistor is substantially larger than the second current-sink transistor; and
the first current-sink transistor is substantially larger than the second current-sink transistor.

* * * * *

UNITED STATES PATENT AND TRADEMARK OFFICE
CERTIFICATE OF CORRECTION

PATENT NO.   : 5,168,176
DATED        : December 1, 1992
INVENTOR(S)  : Frank M. Wanlass It is certified that error appears in the above-indentified patent and that said Letters Patent is hereby corrected as shown below:

Claim 10, column 9, line 2, change "connected" to "associated".

Signed and Sealed this

Twenty-seventh Day of September, 1994

Attest:

BRUCE LEHMAN

Attesting Officer

Commissioner of Patents and Trademarks